US008586396B2

(12) United States Patent
Hahn et al.

(10) Patent No.: US 8,586,396 B2
(45) Date of Patent: Nov. 19, 2013

(54) METHOD FOR PRODUCING A SILICON SOLAR CELL WITH A BACK-ETCHED EMITTER AS WELL AS A CORRESPONDING SOLAR CELL

(75) Inventors: Giso Hahn, Constance (DE); Helge Haverkamp, Constance (DE); Bernd Raabe, Constance (DE); Amir Dastgheib-Shirazi, Constance (DE); Felix Book, Constance (DE)

(73) Assignees: Universität Konstanz (DE); Fraunhofer Gesellschaft zur Förderung der Angewandten Forschung E.V. (DE)

( * ) Notice: Subject to any disclaimer, the term of this patent is extended or adjusted under 35 U.S.C. 154(b) by 772 days.

(21) Appl. No.: 12/670,774

(22) PCT Filed: Jul. 23, 2008

(86) PCT No.: PCT/EP2008/059647
§ 371 (c)(1),
(2), (4) Date: May 7, 2010

(87) PCT Pub. No.: WO2009/013307
PCT Pub. Date: Jan. 29, 2009

(65) Prior Publication Data
US 2010/0218826 A1    Sep. 2, 2010

(30) Foreign Application Priority Data

Jul. 26, 2007   (DE) .......................... 10 2007 035 068
Dec. 27, 2007   (DE) .......................... 10 2007 062 750

(51) Int. Cl.
*H01L 21/00* (2006.01)
(52) U.S. Cl.
USPC ............................................. 438/57; 136/255
(58) Field of Classification Search
USPC ....................................... 438/57, 98; 136/255
See application file for complete search history.

(56) References Cited

U.S. PATENT DOCUMENTS

| 5,160,933 A | 11/1992 | Hager |
| 5,394,005 A | 2/1995 | Brown et al. |

(Continued)

FOREIGN PATENT DOCUMENTS

| DE | 19621144 A1 | 11/1996 |
| EP | 0851511 A1 | 7/1998 |

(Continued)

OTHER PUBLICATIONS

International Search Report, PCT/EP2008/059647, dated Aug. 28, 2009.

(Continued)

*Primary Examiner* — Shaun Campbell
(74) *Attorney, Agent, or Firm* — Lerner, David, Littenberg, Krumholz & Mentlik, LLP

(57) ABSTRACT

A method is presented for producing a silicon solar cell with a back-etched emitter preferably with a selective emitter and a corresponding solar cell. According to one aspect, the method comprises the following method steps: producing a two-dimensionally extending emitter at an emitter surface of a solar cell substrate; applying an etching barrier onto first partial zones of the emitter surface; etching the emitter surface in second partial zones of the emitter surface not covered by the etching barrier; removing the etching barrier; and producing metal contacts at the first partial zones. During the method, especially during the etching of the emitter surface in the second partial zones, a porous silicon layer is advantageously produced, which is then oxidized. This oxidized porous silicon layer can subsequently be etched away together with any phosphorus glass that may be present. The method makes use of conventional screen-printing and etching technologies and is thus compatible with current industrial production plants.

19 Claims, 2 Drawing Sheets

(56) References Cited

U.S. PATENT DOCUMENTS

| | | | |
|---|---|---|---|
| 5,949,123 A * | 9/1999 | Le et al. | 257/496 |
| 6,091,021 A * | 7/2000 | Ruby et al. | 136/261 |
| 7,883,343 B1 * | 2/2011 | Mulligan et al. | 439/98 |
| 2003/0199148 A1 | 10/2003 | Pannek | |
| 2003/0224586 A1 * | 12/2003 | Sabnis | 438/484 |
| 2005/0126619 A1 | 6/2005 | Abe et al. | |

FOREIGN PATENT DOCUMENTS

| | | |
|---|---|---|
| JP | 51117591 A | 10/1976 |
| JP | 02-177569 A | 7/1990 |
| JP | 02-230776 A | 9/1990 |
| JP | 3083339 A | 4/1991 |
| JP | 6045622 A | 2/1994 |
| JP | 08-162668 A | 6/1996 |
| JP | 2000263556 A | 9/2000 |
| JP | 2002503390 A | 1/2002 |
| JP | 2003229589 A | 8/2003 |
| JP | 2004253424 A | 9/2004 |
| JP | 2008282912 A | 11/2008 |
| RU | 96115016 | 10/1998 |
| RU | 2210142 C1 | 8/2003 |
| SU | 1814460 A3 | 8/1998 |
| WO | 9636990 A1 | 11/1996 |
| WO | 03073516 A1 | 9/2003 |

OTHER PUBLICATIONS

Menna P et al: Solar Energy Materials and Solar Cells, 37; 13-24 (1995).

Lagoubi A et al: "Conditioning of n-Silicon by Photoelectrochemical Etching for Photovoltaic Applications" (Oct. 12, 1992), 11th. E.G. Photovoltaic Solar Energy Conference. Proceedings of the International Conference. Montreux, Oct. 12-16, 1992; [Proceedings of file International Photovoltaic Solar Energy Conference], Chur, Harwood Academic, CR, pp. 250-253 , XP001137549.

Lehmann et al., Materials Science and Engineering, B69-70; 11-22 (2000).

Ludemann et al., Novel Processing of Solar Cells with Porous Silicon Texturing, 299-302 (2000).

Szlufcik et al., Appl. Phys. Lett., 59(13); 1583-1584 (1991).

Smith et al., Journal of Electronics Materials, 17(6); 533-541 (1988).

Debarge et al., "Phosphorous emitter etch back and bulk hydrogenation by means of an ECR-hydrogen plasma applied to form a selective emitter structure on mc-Si", Energy Materials & Solar Cells 72 (2002) 247-254.

Mouhoub et al., "Selective emitters diffusion using an air belt furnace", The European Physical Journal Applied Physics 30, 3-6 (2005).

Zerga et al., "Selective emitter formation for large-scale industrially MC-SI solar cells by hydrogen plasma and wet etching", 21st European Photovaltaic Solar Energy Conference, Sep. 4-8, 2006, Dresden, Germany, pp. 865-869.

* cited by examiner (a)

(b)

(d)

(e)

(f)

(g)

METHOD FOR PRODUCING A SILICON SOLAR CELL WITH A BACK-ETCHED EMITTER AS WELL AS A CORRESPONDING SOLAR CELL

CROSS-REFERENCE TO RELATED APPLICATIONS

This application is a national phase entry under 35 U.S.C. §371 of International Application No. PCT/EP2008/059647, filed Jul. 23, 2008 in English, which claims the benefit of the filing date of German Patent Application No. 10 2007 035 068.8 filed Jul. 26, 2007 and of German Patent Application No. 10 2007 062 750.7 filed Dec. 27, 2007. The disclosures of said applications are hereby incorporated herein by reference.

BACKGROUND OF THE INVENTION

The present invention relates to a method for producing a silicon solar cell with a back-etched, preferably selective emitter as well as a corresponding solar cell.

It is known that emitters produced at a surface of a solar cell often exhibit, for production-related reasons, a high doping concentration directly at the surface. This high doping concentration can lead to recombination losses, especially with respect to charge carrier pairs generated close to the surface.

It may therefore be desirable to make available a production method for a solar cell, wherein the doping concentration at the surface of the emitter can be reduced in a technologically straightforward manner.

For the most part, the solar cells currently manufactured industrially are produced based on silicon, especially crystalline silicon. The vast majority of these solar cells are provided with a full-area homogeneous emitter layer at the front-side surface and/or at the rear-side surface of the solar cell substrate. The metal contacts are produced by means of thick-film pastes in the screen-printing process in the case of many of the silicon solar cells industrially produced nowadays. For this purpose, a metal-particle-containing paste is printed locally onto the front-side emitter and then fired into the emitter, in order to form a good electrical contact with the emitter layer.

It is known here that it may be necessary to provide the emitter layer, at least in the zones contacted by the metal contacts, with a high doping concentration in the region of the emitter surface in order to obtain a good ohmic contact.

A characteristic parameter for assessing the quality of the emitter, i.e. the doping concentration integrated over the cross-section of the emitter layer, is the so-called sheet resistance. The greater the sheet resistance, the smaller the doping concentration inside the emitter layer and the smaller, as a rule, the doping concentration at the surface of the emitter layer. It has been found that, with conventionally produced emitters, a maximum sheet resistance of emitters capable of being contacted with screen-printing metallisation techniques typically lies in the range from 50-60 ohms per square. Emitter layers with higher sheet resistances and thus fundamentally lower doping usually can no longer be contacted reliably by means of thick-film pastes.

When using industrially advantageous screen-printing metallisation techniques, it is therefore necessary to make available emitter layers with a high surface doping concentration in the region of the metal contacts. On the other hand, however, it is known that such a high surface doping concentration can be accompanied by heavy recombination losses at the surface of the solar cell. In particular, charge carrier pairs which are produced by high-frequency (blue or UV) light very close to the front-side solar cell surface recombine rapidly inside this strongly doped emitter layer and can therefore no longer contribute to the solar cell current. This can reduce the IQE (internal quantum efficiency) in the high-frequency light spectrum and thus the total current supplied by the solar cell, which ultimately reduces the efficiency of the solar cell. An additional effect of a high surface doping concentration may be a so-called band gap narrowing, which can lead to a reduced open circuit voltage. Attempts to meet these contradictory requirements for good contactability on the one hand and a high IQE on the other hand led to the concept of the so-called selective emitter. In the case of the latter, the emitter zones directly beneath the metal contacts are strongly doped locally, whereas the zones lying in between have a much lower doping concentration.

Several methods for producing selective emitter structures have already been developed and tested, mainly on the laboratory scale. In one approach, a selective emitter structure can be produced by two separate diffusion processes in two separate process steps using a local masking layer, for which dielectric layers are often used. Here, however, there is the need for a plurality of high-temperature diffusion processes, and this can increase the production cost significantly. Alternatively, a selective emitter structure can be produced by local etching of an emitter layer previously produced homogeneously.

However, such production methods are often not compatible with the other process steps currently used industrially, such as for example the screen-printing metallisation. Furthermore, problems can occur in the sense that the doping concentration is locally inhomogeneous in the individual emitter zones due to a non-uniform etching process.

Previous approaches at producing silicon solar cells with a selective emitter using two diffusion processes have usually been technically expensive and scarcely able to be implemented industrially on account of their high cost. On the other hand, the production of a selective emitter structure by local etching of the emitter has for the most part only been achieved in the laboratory hitherto, methods chiefly having been tested in which etching of the emitter has been carried out after a metallisation of the solar cells. These production methods have usually led to a considerable decline in the efficiency of the solar cells or were scarcely able to be implemented on an industrial scale.

SUMMARY OF THE INVENTION

It can therefore be regarded as a problem of the present invention to propose a method for producing a silicon solar cell, especially with a selective emitter, wherein the aforementioned problems of the prior art, in particular, can be at least partially overcome. In particular, a production method for a silicon solar cell may be desired, wherein an emitter with a low doping concentration at the surface can be obtained. Furthermore, a production method for a silicon solar cell with a selective emitter may be desired that is compatible with other conventional, industrially established production steps, is cost-effective and permits the production of solar cells with a high efficiency. Furthermore, a need for a corresponding solar cell may exist.

These problems and requirements can be met by a method and a solar cell according to the independent claims. Advantageous embodiments are indicated in the dependent claims.

According to a first aspect of the present invention, a method for the production of a silicon solar cell with a back-etched emitter is presented, wherein the method comprises in the following order: producing a two-dimensionally extending emitter at an emitter surface of a solar cell substrate; producing a layer of porous silicon at the emitter surface; back-etching the layer of porous silicon.

The indicated method according to the invention, according to the first aspect, can be regarded as being based on the idea that a layer of porous silicon is produced in a emitter layer and is then back-etched, in order in this way to remove the near-surface, strongly doped zones of the emitter layer. As is stated in greater detail below with respect to preferred embodiments, such back-etching of a porous layer can be carried out in a technologically straightforward manner.

According to a second aspect of the present invention, a method for producing a silicon solar cell with a selective emitter is presented, wherein the method comprises the following steps: producing a two-dimensionally extending emitter at an emitter surface of a solar cell substrate; applying an etching barrier onto first partial zones of the emitter surface; etching the emitter surface in second partial zones of the emitter surface not covered by the etching barrier; removing the etching barrier; and producing metal contacts at the first partial zones. The method steps are preferably carried out in the order indicated.

The indicated method according to the invention, according to the second aspect, can be regarded as being based on the idea that, in the first place, an emitter is produced on at least one surface of a solar cell substrate with a homogeneous doping concentration, which is high enough for it to be suitable, for example, for contacting in the screen-printing process. First partial zones of the emitter surface are protected by an etching barrier, preferably directly after this production of the two-dimensionally extending emitter, i.e. preferably before the deposition of a dielectric layer, for example as an antireflection or passivation layer, and also preferably before the application of the metal contacts. The unprotected zones of the emitter surface are then etched and the thickness of the emitter in these zones is thus reduced, so that an emitter with an increased sheet resistance arises in these second partial zones. The etching barrier is then removed and the solar cell can be further processed in a conventional manner, i.e. a dielectric layer can for example be deposited at the front-side surface as an antireflection or passivation layer, and then metal contacts can then be applied over the latter, for example in the screen-printing process.

The presented method according to the first or second aspect can bring a number of advantages. A cost-effective method that can readily be implemented industrially can be made available for producing a full-area or partial-area back-etched, preferably selective emitter structure. To advantage, technologies can be used for the individual method steps that have already been used and tried and tested on an industrial scale. For example, an etching-resistant lacquer or resist can be applied by means of screen-printing as an etching barrier and the subsequent etching can be carried out with the aid of conventional wet-chemical etching processes. The method advantageously dispenses with the use of cost-intensive vacuum technologies.

Since use is preferably made solely of technologies which have in any case long been in use in solar cell production, the technological risk with the implementation of the method can be kept low. Chemicals that can be used for the etching step are already used in the production of solar cells. Screen-printing lacquers which can be used as an etching barrier are already used in the industrial manufacture of printed circuit boards. For the implementation of the method, therefore, technologies, employed media and consumables as well as their methods of disposal are known, fully developed and already in use.

Since the method can in particular also be used in a way in which only a few, easily controllable method steps are added to a conventional processing sequence for the production of silicon solar cells, the method can in particular be easily integrated into existing production plants by the installation of one or more additional modules.

Further details, possible advantages and preferred embodiments of the method according to the invention are explained below.

The method can be used for the production of any silicon solar cell. For example, solar cells can be produced based on mono-crystalline or multi-crystalline silicon wafers or alternatively also based on a crystalline or amorphous silicon thin layer.

A selective emitter is formed at a surface of the solar cell substrate referred to hereinafter as "emitter surface". To advantage, the "emitter surface" can be the front-side surface of the solar cell substrate pointing towards the sun in use. Alternatively or additionally, an emitter can also be formed at a rear-side surface. A selective emitter is understood here to mean a doped semiconductor layer of a conduction type (for example n-type) opposite to the conduction type of the basis substrate (for example p-type), wherein the doping concentration varies greatly locally over the emitter area. For example, the emitter can be strongly doped before the back-etching, i.e. in the variant of the selective emitter first partial zones of the emitter at which front metallisation is subsequently to be disposed can be strongly doped, with a high surface doping concentration of, for example, more than $5 \times 10^{19}$ cm$^{-3}$, which leads to a sheet resistance of, for example, less than 60 ohms per square, preferably less than 50 ohms per square, and more preferably less than 40 ohms per square in these emitter zones, whereas, in the variant of the selective emitter, other emitter zones lying in between can be doped more weakly, for example with a surface doping concentration of less than $1 \times 10^{19}$ cm$^{-3}$, which leads to a sheet resistance of, for example, more than 60 ohms per square, preferably more than 70 ohms per square, and more preferably more than 80 ohms per square. The strongly doped zones can subsequently be contacted electrically very well with metal contacts, whereas the weakly doped zones can exhibit a higher IQE and lower emitter saturation current.

Details of the invention according to the second aspect described above will be explained in greater detail below, wherein the remarks can of course also be transferred analogously to the corresponding features of the invention according to the first aspect.

As the first main method step of the method presented, a two-dimensionally extending emitter is produced at the emitter surface of a solar cell substrate. Any methods can be used for this purpose. For example, the two-dimensionally extending emitter can, as described below in greater detail, be diffused into the surface of the solar cell substrate by means of a POCl$_3$ gas-phase diffusion by diffusing phosphorus from a hot gas phase. Any other technologies can however also be used, such as for example diffusion from a, for example, printed solid doping source, deposition of an additional separate emitter layer, spray-on or spin-on of phosphorus-containing substances, implantation of doping agents into the surface of the solar cell substrate, etc. The parameters for producing the two-dimensionally extending emitter are selected in such a way that an emitter sheet resistance of less than 60 ohms per square is preferably established, preferably less than 50 ohms per square and more preferably less than 40 ohms per square.

An etching barrier is then applied onto first partial zones of the front-side surface of the solar cell substrate. The most varied technologies can be used for this purpose. Use is preferably made of technologies which are easy to implement industrially, such as for example the printing of a thick-film paste by means of screen-printing, the local spraying-on of a curable solution by means of an inkjet process, aerosol printing, vapour deposition through a mask, etc.

As an etching barrier, a material is selected which is such that it is not attacked during the subsequent etching step by the etching medium used, so that the etching barrier can protect the underlying first partial zones of the emitter surface against the etching medium.

The zones of the emitter surface of the solar cell substrate not protected by the etching barrier are then etched with the aid of an etching medium. As an etching medium, various etching fluids can be used which can attack and dissolve the material of the solar cell substrate at its front side. Since this material is as a rule silicon or, e.g. after an additional optional oxidation step, silicon oxide, consideration is given for example to gases or solutions which contain for example hydrofluoric acid (HF) and/or nitric acid ($HNO_3$).

The emitter surface is preferably etched down in the second partial zones to an extent such that, in the remaining emitter layer, a desired high sheet resistance of, for example, more than 60 ohms per square, preferably more than 70 ohms per square and more preferably more than 80 ohms per square is established with a surface concentration of the doping agent, such as for example phosphorus, that is reduced by wet-chemical etching. The sheet resistance of the remaining emitter layer can be checked during the etching process, in that the thickness of the layer already etched down, for example, is observed optically, or the etching process can be interrupted briefly in order to measure the layer resistance, for example by means of a conventional 4-point measurement. In this way, the etching process can be terminated when a predetermined limiting value for the sheet resistance is reached. Alternatively, the duration of the etching process up to reaching a specific desired sheet resistance can be ascertained by preliminary tests.

After the etching process, the etching barrier is again removed from the substrate surface. This preferably takes place chemically, for example with the aid of a solution which attacks and dissolves the etching barrier.

Optionally, a further etching process can follow, in which a phosphorus glass produced in a $POCl_3$ diffusion, for example, can be etched away, wherein in the same step the second partial zones already etched in the preceding etching step can be further etched or an oxide optionally produced there can be etched away. The sheet resistance ultimately established in the second partial zones can thus be influenced by the first etching process described above as well as by this optional second etching process.

Optionally, further etching steps can follow, such as for example the preparing of a dielectric layer as an antireflection and/or passivation layer on the emitter surface of the solar cell substrate.

Metal contacts are then produced at the first partial zones, which have been protected temporarily by the etching barrier against etching of the emitter layer in the preceding course of the process. Due to the high surface doping concentration, i.e. the low sheet resistance, in these first partial zones, a good ohmic contact can be achieved between the metal contacts and the silicon solar cell substrate. The metal contacts can be produced using any technologies. Technologies which can easily be implemented industrially, such as for example the screen-printing of a metal-particle-containing thick-film paste, are however preferred.

According to the first aspect and a preferred embodiment of the second aspect, the method comprises the additional step of producing a porous silicon layer. This method step is carried out, in the embodiment of the second aspect, after the deposition of the etching barrier at the second partial zones of the emitter surface of the solar cell substrate not covered by the etching barrier. This method step can preferably be carried out simultaneously with the method step of etching the emitter surface in the second partial zones not covered by the etching barrier. In other words, instead of etching the emitter surface area-wide in the zones unprotected by the etching barrier, an etching method is selected which leads to the formation of an at least partially porous silicon layer. This can be achieved by the correct selection of a suitable etching solution and suitable etching boundary conditions, such as for example a suitable temperature, a suitable etching duration, etc. The porous silicon layer can be produced with good spatial homogeneity and the thickness of the resultant silicon layer can be influenced by a suitable selection of the process parameters.

According to a further embodiment, the previously produced porous silicon layer is then oxidised. For this purpose, it can be subjected for example to an oxidising medium, such as for example an acid or an ozone-containing, wet-chemical bath or another ozone-containing or ozone-producing source. To advantage, the etching barrier should in this case also be resistant to this oxidising medium.

The process parameters during the oxidising of the porous silicon layer, for example process duration, process temperature, oxidation capacity of the medium used, etc., can be selected such that the whole porous layer is oxidised.

According to another embodiment, the porous silicon layer, previously oxidised as the case may be, can then be etched in a further method step and thus be removed. Due to the fact that the surface of the emitter layer is not simply etched area-wide in a single etching step, but that a porous layer is first produced which is subsequently oxidised and then etched away, a more homogeneous etching results can be achieved. The porous silicon layer can also be alkaline etched without having been oxidised beforehand.

According to yet another embodiment, the etching of the oxidised porous silicon layer is carried out after the removal of the etching barrier. To advantage, use can be made of the fact that the oxidised porous silicon layer can be attacked by etching media which cannot or can scarcely attack pure, non-oxidised silicon. According to this embodiment, therefore, etching can first be carried out in the second partial zones unprotected by the etching barrier and a porous silicon layer can be produced and then oxidised; the etching barrier can subsequently be removed; the porous silicon layer can then be removed in a further etching process, whereby, with a suitable selection of the etching medium, the first partial zones previously protected by the etching barrier cannot or can scarcely be attacked in this process. To advantage, a phosphorus glass produced during the production of the two-dimensionally extending emitter can also be jointly removed in this additional etching step.

According to another embodiment, the thickness of the produced porous silicon layer can be detected optically. The porous silicon layer has a refractive index that is different from solid silicon, so that interference effects can occur with thin porous silicon layers. Depending on the thickness of the porous silicon layer, the latter can, similar to an antireflection layer, appear in different colours. The thickness of the produced porous silicon layer can thus already be estimated during the etching process on the basis of the colour of the porous silicon layer. Since the porous silicon layer is preferably completely removed in a following etching step, as a result of which the thickness of the emitter layer remaining beneath in the solar cell substrate is reduced, it is thus possible indirectly to deduce optically how high the sheet resistance of the remaining emitter layer will be after removal of the porous silicon layer. Alternatively, the thickness of the produced porous silicon layer could also be determined ellipsometrically.

According to another embodiment, the step of etching the emitter surface, the production of the porous silicon layer and/or the oxidation of the porous silicon layer is carried out in a liquid solution. Acid solutions, for example, can be used. For example, use can be made of solutions of acids which attack silicon or silicon oxide, such as for example HF, $HNO_3$, $H_2SO_4$ or combinations thereof. The use of liquid etching solutions enables, amongst other things, very homogeneous etching with a high etching capacity and/or etching rate.

According to another embodiment, the production of the two-dimensionally extending emitter is carried out by means of a $POCl_3$ gas-phase diffusion or by spray-on or spin-on and the phosphorus glass thereby arising is not removed before the application of the etching barrier. The $POCl_3$ gas-phase diffusion can readily be implemented industrially and finds widespread use. The phosphorus glass arising in the diffusion usually has to be removed again from the emitter surface after the diffusion, before, for example, further antireflection or passivation layers are deposited. In the method presented, this etching away of the phosphorus glass does not however have to take place directly after the diffusion, when it would represent an additional method step, but can be carried out simultaneously with one of the subsequent etching steps, for example the etching step for removing the porous silicon layer after the removal of the etching barrier. In this way, the processing outlay and the associated costs can be reduced.

According to another embodiment, the etching barrier is applied with the aid of a paste containing plastic. Such a paste can be highly viscous (thick-flowing), so that it can be printed locally, for example by means of conventional screen-printing technology, onto the first partial zones of the emitter surface to be protected. Alternatively, the paste can be low-viscous (fluid), so that it can be sprayed on locally for example in the inkjet process. The initially viscous paste can then be hardened, for example by heat treatment or by irradiation with UV light, and thus acquire a property as a reliable etching barrier.

According to another embodiment, the etching barrier and/or the metal contacts can be applied by means of screen-printing. The screen-printing technology is well tried and tested industrially and is associated with many advantages. In addition, screen-printers and the relevant know-how are already available with many conventional production plants, so that the plants can easily be modified for the implementation of the method presented.

According to another aspect of the present invention, a silicon solar cell with a selective emitter is presented. The solar cell comprises: a solar cell substrate with a two-dimensionally extending emitter at a front-side and/or rear-side surface thereof serving as an emitter surface, a dielectric layer and emitter metal contacts at the emitter surface. The two-dimensionally extending emitter has a higher surface doping concentration in first partial zones than in adjacent second partial zones. In other words, it is a selective emitter. The solar cell substrate has a greater thickness in the first partial zones than in the second partial zones. In other words, there is a small step between the first and the second partial zones, such as can arise for example with the back-etching of the emitter during a production process, as has been described above. The dielectric layer, for example made of silicon nitride or silicon oxide, which can serve for example as an antireflection and/or passivation layer, essentially covers the whole emitter surface and is arranged locally between the emitter metal contacts and the solar cell substrate. In other words, the dielectric layer separates the emitter metal contacts at least partially from the surface of the solar cell substrate, whereby the metal contacts can however at least locally penetrate the dielectric layer in order to enable an electrical contact between the metal contacts and the solar cell substrate.

The presented silicon solar cell can advantageously be produced, amongst other things, with the aid of the method described above. On account of the selective emitter, it exhibits a high degree of efficiency. It is also advantageous that the dielectric layer of the solar cell, which is unavoidable for good antireflection and passivation properties, is located beneath the emitter metal contacts, so that the metal contacts lie free and can be contacted or soldered without prior removal of a dielectric layer covering them.

Several possible properties and advantages of the production method and of the solar cell according to the embodiments of the present invention are explained below.

The method enables the cost-effective application of a back-etched and/or selective emitter structure with an increase in the efficiency of the produced solar cells over four percent relative, brought about by increasing the short-circuit current and/or open circuit voltage and/or filling factor of the solar cell.

Apart from the increase in the efficiency, a solar cell with a selective emitter structure can offer further advantages. In a standard solar cell with a homogeneous emitter, the alloying of the metal contacts can represent a critical process step. The process window for establishing the required temperatures can be relatively small, because the sheet resistances of the emitter of 50 to 60 ohms per square are already at the bounds of what is possible. In the case of a selective emitter structure, higher doping can be selected beneath the metal contacts, i.e. in the first partial zones, so that the window of possible process parameters is larger.

In the optimisation of thick-film pastes, a compromise has had to be reached hitherto between finger conductivity, contact resistance and rheology (flow behaviour). Since a good electrical contact is easier to produce with a selective emitter, thick-film pastes can be optimised for other parameters, such as for example a higher finger conductivity and an optimised flow behaviour, which enables the screen-printing of finer fingers.

The selective emitter structure can directly permit the use of cost-effective screen-printing pastes, without the efficiency of the solar cells being influenced unfavourably.

In addition, a selective emitter enables the appropriate use of methods for producing finer metal contacts. For the purpose of reducing shadow losses, it is possible to produce a metal grid with finer fingers. Typical conventional finger widths lie in the range between 100 and 140 µm. If the finger width is reduced below 80 µm, the solar cell delivers more current on account of the smaller shadow due to the metallisation. The series resistance may however increase in the case of conventional solar cells, because the contact area between the metallisation and the substrate surface is also reduced. In the case of the cell with a selective emitter, the specific contact resistance can be reduced on account of the higher doping beneath the fingers, so that the total series resistance does not increase.

In order to guarantee process stability, an additional development of other measuring devices for use in a production line implementing the presented production method is not required. Commercially available optical and electrical measuring devices already used in solar cell manufacture are capable of monitoring the process online. The process is very easy to control and moreover is stable and variable.

Furthermore, it has emerged that, in the case of solar cells which have been produced according to the presented methods, it is possible by means of the back-etching—over the whole area or in the zones not protected by the etching barrier—to produce an emitter which exhibits an advantageous doping profile. Emitters, with which a doping agent source has been brought directly into contact with the solar cell substrate surface for their production and the doping agents have then been diffused into the surface at high process temperatures, have an extremely high doping concentration directly at the surface. This can have a particularly unfavourable effect on the solar cell properties in the presence of illumination with high-frequency (blue or UV) light. This very strongly doped superficial layer can be removed by back-etching in the second partial zones of the emitter surface, which can have a favourable effect on the IQE in the short-wave spectral region. It has been found that the doping profile with the back-etched emitters runs very much flatter than in the case of emitters directly after the diffusion, which overall exhibit the same sheet resistance. For example, it has been found that a back-etched emitter with a sheet resistance of 60 ohms per square can, for example, have similarly good properties with respect to the IQE and/or emitter saturation current density $J_{0e}$ as a conventionally produced emitter with a sheet resistance of 100 ohms per square. With the methods presented, relatively low sheet resistances of, for example, 60 to 80 ohms per square can thus also be accepted in the second partial zones which lie between the metal contacts in the finished solar cell, without this having a negative effect on the IQE of the solar cell. At the same time, the total series resistances inside the solar cell can be reduced with such low sheet resistances, which overall has a favourable effect on the efficiency of the solar cell.

It is pointed out that features described previously in respect of individual embodiments of the present invention can be arbitrarily combined with one another. In particular, features which have been described for the production method can be combined with features of the solar cell according to the invention.

The previously described and further aspects, features and advantages of the present invention can be seen from the following description of specific embodiments making reference to the appended drawings.

BRIEF DESCRIPTION OF THE DRAWINGS

The invention will now be explained in further detail with reference to the drawings.

The drawings are in each case only diagrammatic sketches. In particular, the thicknesses of the individual layers are not represented true to scale. Identical or similar reference numbers in the drawings denote identical or similar elements.

DETAILED DESCRIPTION

Figure 1:
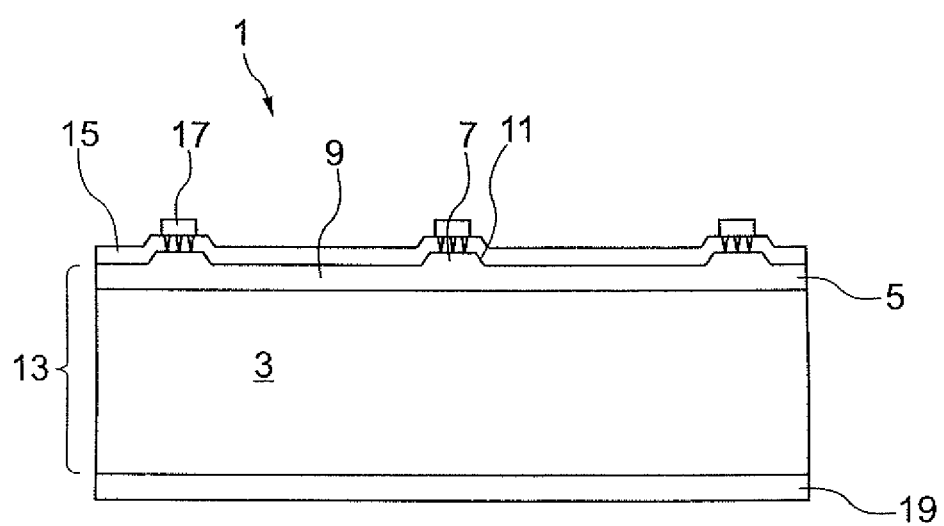
FIG. 1 shows a cross-section of a solar cell according to an embodiment of the present invention.

FIG. 1 shows a solar cell 1 with a p-conducting base and an n-conducting two-dimensionally extending selective emitter 5. Emitter 5 has first partial zones 7 and, in between, second partial zones 9, the thickness of second partial zones 9 being smaller than that of first partial zones and the layer resistance of second partial zones 9 being greater than that of first partial zones 7. A small step 11 extends between first partial zones 7 and second partial zones 9. Extending over the whole front-side surface of solar cell substrate 13, which contains base 3 and emitter 5, is a dielectric layer 15 made of silicon nitride, which at the same time serves as an antireflection layer and as a surface passivation. Finger-shaped metal contacts 17 are arranged over dielectric layer 15 in the region of first thicker partial zones 7 of selective emitter 5, dielectric layer 15 being located between metal contacts 17 and the surface of solar cell substrate 13, but being partially penetrated by so-called "spikes", which run from metal contacts 17 to the surface of emitter 5 in order to produce an ohmic contact with this surface. A two-dimensionally extending aluminium back contact 19 is located at the rear side of the solar cell.

Figure 2:
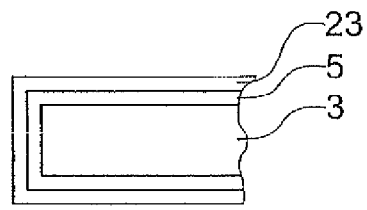
FIG. 2 (a)-(g) show a solar cell in various stages of a production method according to a further embodiment of the present invention.
Figure 2:
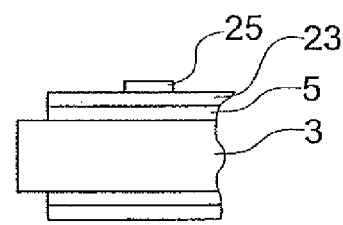
Figure 2:
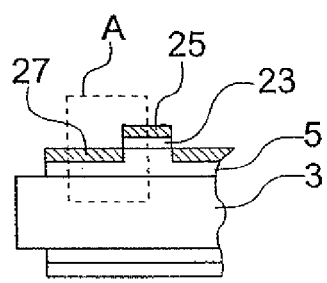
Figure 2:
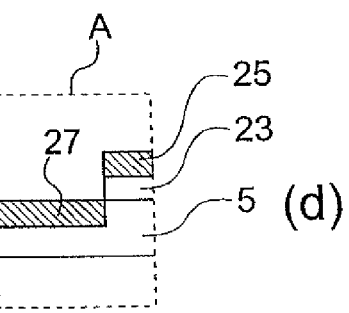
Figure 2:
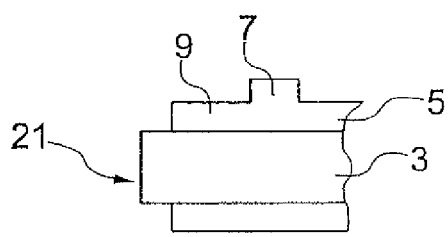
Figure 2:
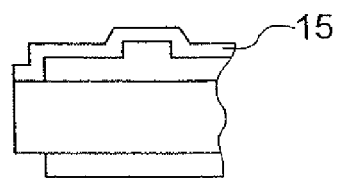
Figure 2:
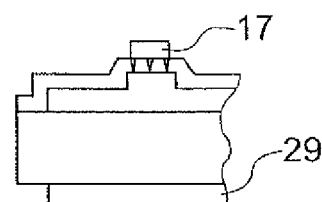

A sequence of production steps for the production of a solar cell according to an embodiment of the present invention is described with the aid of FIG. 2.

The starting point is a silicon wafer 21. This can have been previously surface-textured and cleaned (step (a)).

A two-dimensionally extending emitter layer 5 is diffused, with the aid of a $POCl_3$ gas-phase diffusion at high temperatures of approx. 800 to 1000° C., into the surface of p-conducting wafer 21, which for the most part subsequently provides base 3. With this diffusion process, a phosphorus glass layer 23 is formed at the surface of emitter layer 5 thus produced (step (b)).

The so-called edge insulation then takes place, in which the electrical connection between emitter 5 produced on the front side and the emitter region produced on the rear side is separated. For this purpose, wafer 21 provided with the emitter can for example be subjected to an etching plasma at its edge, so that the outermost layer of the wafer containing emitter 5 is etched away. An etching barrier 25 is then printed onto phosphorus glass layer 23 in the form of elongated fingers (normal to the plane of the drawing in the figure) by means of screen-printing. For this purpose, use can for example be made of a screen-printing paste from the firm Peters Lackwerke (Germany) with the name SD2052A1, which can form a layer made of an organic plastic (step (c)).

After the material of etching barrier 25 has been hardened thermally or by irradiation with UV light, the front-side surface of the solar cell substrate is subjected to an $HF-HNO_3-H_2O$ solution. The etching solution first etches away phosphorus glass layer 23 in the zones not protected by etching barrier 25 and then attacks emitter 5 lying beneath, whereby it forms a layer 27 of porous silicon. As can readily be seen in the enlarged detail (A), porous silicon layer 27 extends into emitter layer 5 (step (d)).

The produced porous silicon layer is then oxidised in an acid which contains nitric acid ($HNO_3$) or sulphuric acid ($H_2SO_4$).

After etching barrier 25 has been removed, for example by dissolution ("stripping") in sulphuric acid, phosphorus glass layer 23 remaining beneath and, at the same time, also the produced oxidised porous silicon in second partial zones 9 are etched away in a hydrofluoric acid solution ($HF+H_2O$) (step (e)).

In this way, a selective emitter 5 with more strongly doped thick first partial zones 7 and more weakly doped thin second partial zones 9 has thus been produced at the surface of wafer 21 serving as solar cell substrate 13.

A dielectric layer 15 serving as an antireflection layer and passivation layer is then deposited over the whole front-side surface, for example in the PECVD process (Plasma Enhanced Chemical Vapour Deposition) (step (f)).

Thick-film metal contacts 17 are then printed, by means of screen-printing using a silver-particle-containing thick-film paste, onto strongly doped first partial zones 7 over dielectric layer 15. A two-dimensionally extending back contact 29 is printed onto the rear side of the solar cell substrate using an aluminium-particle-containing thick-film paste. In a following sintering step, the printed-on contacts are fired in, whereby front-side metal contacts 17 partially "eat through" dielectric layer 15 and thus produce contact with emitter 5 lying beneath (step (g)).

In conclusion, it is pointed out that the terms "comprise", "include" etc. are not intended to exclude the presence of other additional elements. The term "a" likewise does not exclude the presence of a plurality of elements or objects. Furthermore, in addition to the method steps stated in the claims, further method steps may be necessary or advantageous finally to complete the solar cell.

The invention claimed is:

1. A method for producing a silicon solar cell, wherein the method comprises in the following order:
    producing a two-dimensionally extending emitter at an emitter surface of a solar cell substrate;
    producing a porous silicon layer at the emitter surface; and
    back-etching the layer of porous silicon, and
    the method further comprises:
    oxidising the porous silicon layer, and
    etching of the oxidised porous silicon layer,
wherein the etching of the oxidised porous silicon layer is carried out after the removal of an etching barrier.

2. The method according to claim 1, wherein the thickness of the produced porous silicon layer is detected optically.

3. The method according to claim 1, wherein at least one of etching of an emitter surface, the producing of the porous silicon layer and oxidising of the porous silicon layer is carried out with a liquid solution.

4. A method for producing a silicon solar cell, wherein the method comprises in the following order:
    producing a two-dimensionally extending emitter at an emitter surface of a solar cell substrate;
    producing a porous silicon layer at the emitter surface; and
    back-etching the layer of porous silicone,
    wherein the production of the two-dimensionally extending emitter is carried out by means of a POCl$_3$ gas-phase diffusion and wherein phosphorus gas thereby arising is not removed before an application of an etching barrier.

5. The method according to claim 1, wherein an etching barrier is applied with the aid of a paste containing plastic.

6. The method according to claim 1, wherein an etching barrier is applied by means of screen-printing.

7. The method according to claim 1, wherein metal contacts are applied by means of screen-printing.

8. A method for producing a silicon solar cell with a selective emitter, wherein the method comprises in the following order:
    producing a two-dimensionally extending emitter at an emitter surface of a solar cell substrate;
    applying an etching barrier onto first partial zones of the emitter surface;
    producing a porous silicon layer at the second partial zones of the emitter surface not covered by the etching barrier;
    etching the emitter surface in the second partial zones of the emitter surface not covered by the etching barrier;
    removing the etching barrier; and
    producing metal contacts at the first partial zones.

9. The method according to claim 8, further comprising: oxidising the porous silicon layer.

10. The method according to claim 8, further comprising etching of the porous silicon layer.

11. The method according to claim 9, further comprising etching of the oxidised porous silicon layer.

12. The method according to claim 10, wherein the etching of the porous silicon layer is carried out after the removal of the etching barrier.

13. The method according to claim 11, wherein the etching of the oxidised porous silicon layer is carried out after the removal of the etching barrier.

14. The method according to claim 8, wherein the thickness of the produced porous silicon layer is detected optically.

15. The method according to claim 8, wherein at least one of etching of the emitter surface, the producing of the porous silicon layer and oxidising of the porous silicon layer is carried out with a liquid solution.

16. The method according to claim 8, wherein the production of the two-dimensionally extending emitter is carried out by means of a POCl$_3$ gas-phase diffusion and wherein the phosphorus gas thereby arising is not removed before the application of the etching barrier.

17. The method according to claim 8, wherein the etching barrier is applied with the aid of a paste containing plastic.

18. The method according to claim 8, wherein the etching barrier is applied by means of screen-printing.

19. The method according to claim 8, wherein the metal contacts are applied by means of screen-printing.

* * * * *

UNITED STATES PATENT AND TRADEMARK OFFICE
CERTIFICATE OF CORRECTION

PATENT NO. : 8,586,396 B2  Page 1 of 1
APPLICATION NO. : 12/670774
DATED : November 19, 2013
INVENTOR(S) : Hahn et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 875 days.

Signed and Sealed this
Twenty-second Day of September, 2015

Michelle K. Lee
*Director of the United States Patent and Trademark Office*